(12) United States Patent
Sun et al.

(10) Patent No.: US 6,245,380 B1
(45) Date of Patent: *Jun. 12, 2001

(54) METHOD OF FORMING BONDING PAD

(75) Inventors: Shih-Wei Sun, Taipei; Wen-Yi Hsieh, Hsinchu; Water Lur, Taipei; Kun-Chih Wang, Taipei Hsien, all of (TW)

(73) Assignee: United Microelectronics Corp (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/249,582

(22) Filed: Feb. 11, 1999

(51) Int. Cl.[7] ........................................ B05D 5/12
(52) U.S. Cl. .......................... 427/97; 427/98; 427/99; 436/612; 436/638
(58) Field of Search ................... 427/96, 97, 98, 427/99; 438/761, 762, 763, 612, 638

(56) References Cited

U.S. PATENT DOCUMENTS

| | | | |
|---|---|---|---|
| 5,192,581 | * 3/1993 | Hirsch et al. | 427/86 |
| 5,272,111 | * 12/1993 | Kosaki | 427/98 |
| 5,372,969 | * 12/1994 | Moslehi | 437/195 |
| 5,384,288 | * 1/1995 | Ying | 437/288 |
| 5,451,551 | * 9/1995 | Krishnan et al. | 427/124 |
| 5,891,513 | * 4/1999 | Dubin et al. | 427/98 |

* cited by examiner

*Primary Examiner*—Brian K. Talbot
(74) *Attorney, Agent, or Firm*—Blakely Sokoloff Taylor & Zafman

(57) ABSTRACT

A method of forming bonding pad commences by forming a conformal barrier layer on a provided inter-metal dielectric layer. A first metal layer is formed on the barrier layer to partially fill the trench. A thin glue layer is formed on the first metal layer. A second metal layer is formed on the glue layer to fill the trench. The second metal layer, the glue layer, the first metal layer and the barrier layer are partially removed to expose the dielectric layer. A bonding pad structure is thus formed in the trench. The bonding pad structure comprises a first metal pad and a second metal pad.

23 Claims, 5 Drawing Sheets

METHOD OF FORMING BONDING PAD

BACKGROUND OF THE INVENTION

1. Field of the Invention

The invention relates in general to a method of forming interconnections, and more particularly to a method of forming bonding pads.

2. Description of the Related Art

As the requirements on the complexity and precision of an integrated circuit design keep increasing in order to reduce the feature size of a semiconductor device and increase the integration of an integrated circuit, a semiconductor device has to contain more than two metal layers to achieve the fabrication of high-density metal interconnects on a limited surface of a chip. As the design rules of a semiconductor device become finer and higher, the requirements of lower resistivity and higher reliability increase, as well.

Since copper has better conductivity and reliability than aluminum, copper has become a new material used in the metal layers. During a conventional fabrication of interconnections, a copper pad is exposed in the air by a bonding pad window. The oxidation rate of copper is very high so that copper is easily oxidized to form copper oxide. This increases the resistance of the bonding pad and decreases semiconductor device reliability. Furthermore, the bonding pad adheres badly to a sweat joint with a welding line in the conventional fabrication of interconnections. The yield of devices thus decreases due to the bad adhesion.

FIGS. 1A to 1E are schematic, cross-sectional views showing a conventional process of forming a bonding pad.

In FIG. 1A, a substrate 100 having a metal layer thereon is provided. An inter-metal dielectric layer 102 is formed on the substrate 100. A part of the inter-metal dielectric layer 102 is removed to form dual damascene opening 104 and a trench 106 therein.

In FIG. 1B, a conformal barrier layer 108 is formed on the inter-metal dielectric layer 102. A copper layer 110 is formed on the barrier layer 108 to fill the dual damascene opening 104 and the trench 106.

In FIG. 1C a chemical mechanical polishing (CMP) process is performed to remove a part of the copper layer 110 until the inter-metal dielectric layer 102 is exposed. A dual damascene structure 110a and a copper pad 110b are formed within the dual damascene opening 104 and the trench 106. A glue layer 112 and an aluminum layer 114 are formed on the inter-metal dielectric layer 102.

In FIG. 1D, a part of the aluminum layer 114 and a part of the glue layer 112 are removed using a photolithography and etching process to form an aluminum pad 114a on the copper pad 110b.

In FIG. 1E, a passivation layer 116 is formed on the structure shown in FIG. 1D. A part of the passivation layer 116 is removed to form a bonding pad window 118 and to expose the aluminum pad 114a.

The conventional method described above resolves the problem of bad adhesion between the copper pad and a welding line, but an additional mask is required to define the aluminum layer. The additional mask increases the manufacturing cost and complicates the fabrication process for forming bonding pads.

SUMMARY OF THE INVENTION

It is therefore an object of the invention to provide a method of forming bonding pads. An aluminum pad is formed on a copper pad by self-alignment that does not require any additional mask to form the aluminum pad.

According to one aspect of the present invention, a dielectric layer having a trench therein is provided. A conformal barrier layer is formed on the dielectric layer. A conformal first metal layer is formed on the barrier layer to partially fill the trench. A thin glue layer is formed on the first metal layer. A second metal layer is formed on the glue layer to fill the trench. The second metal layer, the glue layer, the first metal layer and the barrier layer are partially removed by chemical mechanical polishing (CMP) to expose the dielectric layer. A bonding pad structure is thus formed in the trench. The bonding pad structure comprises a first metal pad and a second metal pad.

According to another aspect of the invention, a dielectric layer having a trench therein is provided. A conformal barrier layer is formed on the dielectric layer. A first metal layer is formed on the barrier layer to partially fill the trench. The first metal layer and the barrier layer are partially removed by CMP to expose the dielectric layer. A thin glue layer is formed on the first metal layer and on the dielectric layer. A second metal layer is formed on the glue layer to fill the trench. The second metal layer and the glue layer are partially removed by CMP to expose the dielectric layer. A bonding pad structure is thus formed in the trench. The bonding pad structure comprises a first metal pad and a second metal pad.

BRIEF DESCRIPTION OF THE DRAWINGS

Other objects, features, and advantages of the invention will become apparent from the following detailed description of the preferred but non-limiting embodiments. The description is made with reference to the accompanying drawings in which:

FIG. 2, FIG. 6, FIG. 7, FIG. 4 and FIG. 5 are schematic, cross-sectional views showing the steps of a second embodiment of the method of forming bonding pads.

DESCRIPTION OF THE PREFERRED EMBODIMENT

First Embodiment

Figure 1A:
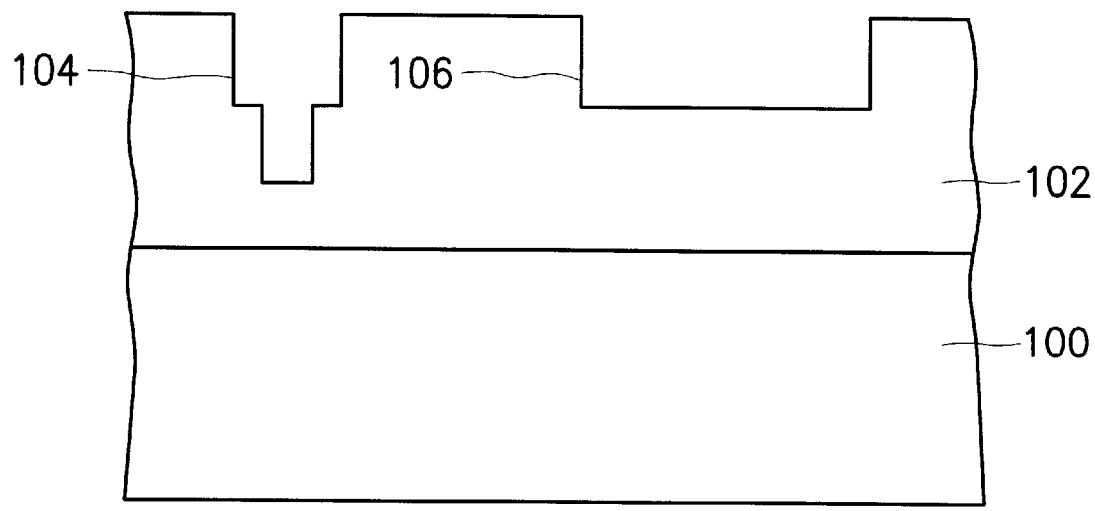
FIGS. 1A to 1E are schematic, cross-sectional views showing a conventional process of forming a bonding pad.
Figure 1B:
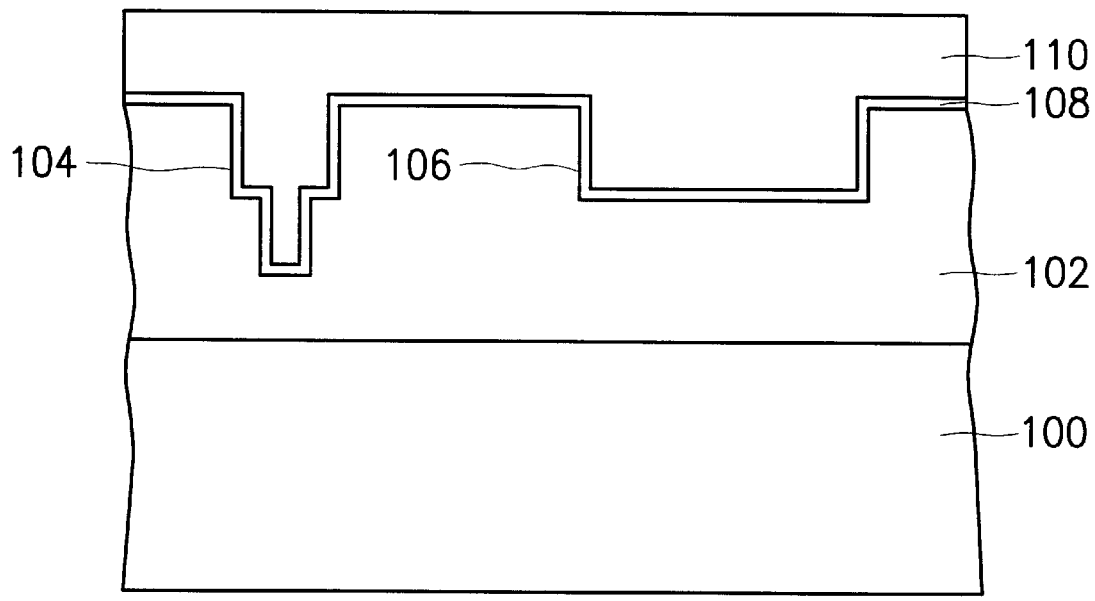
Figure 1C:
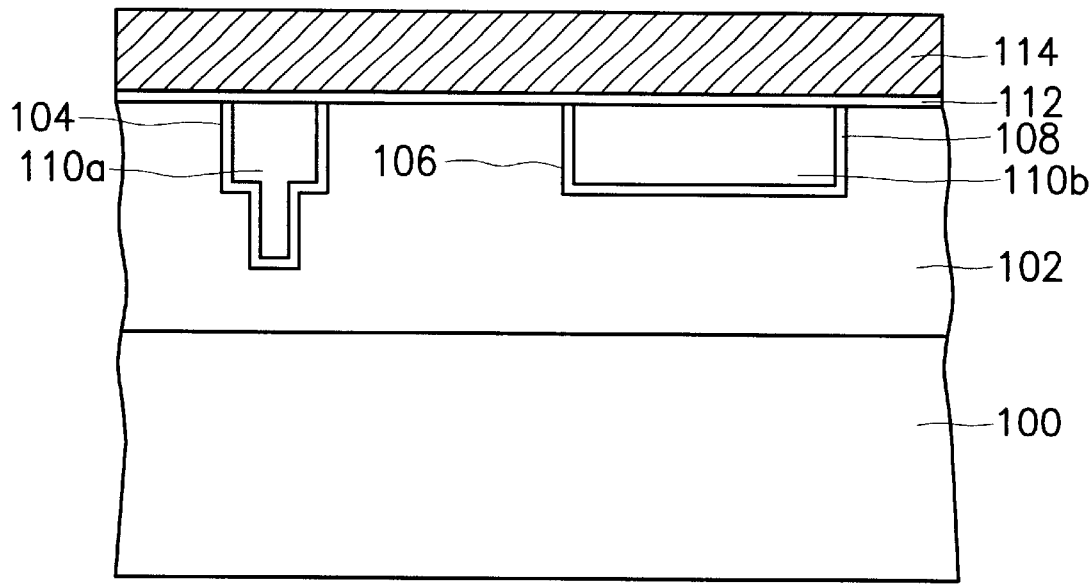
Figure 1D:
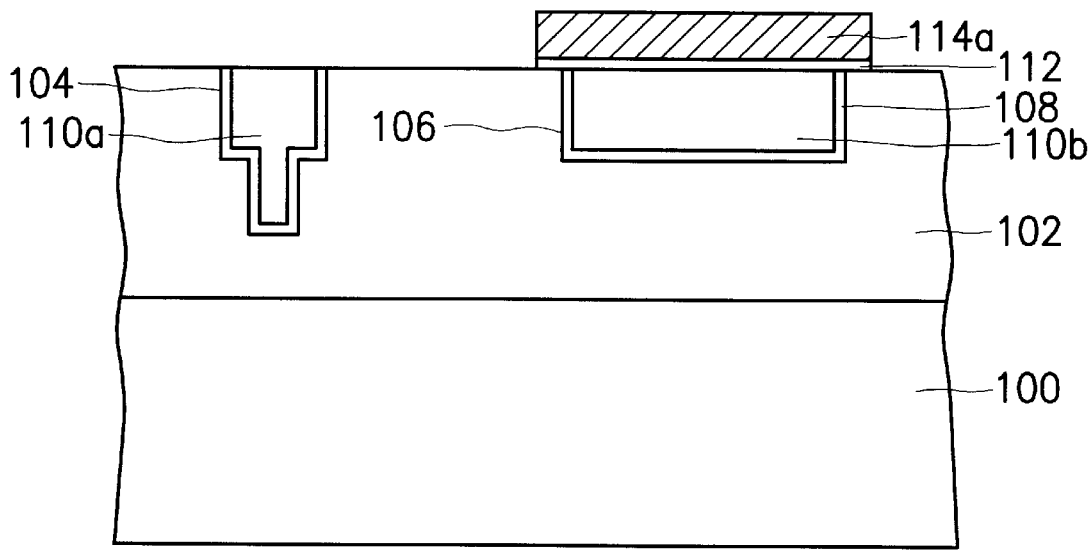
Figure 1E:
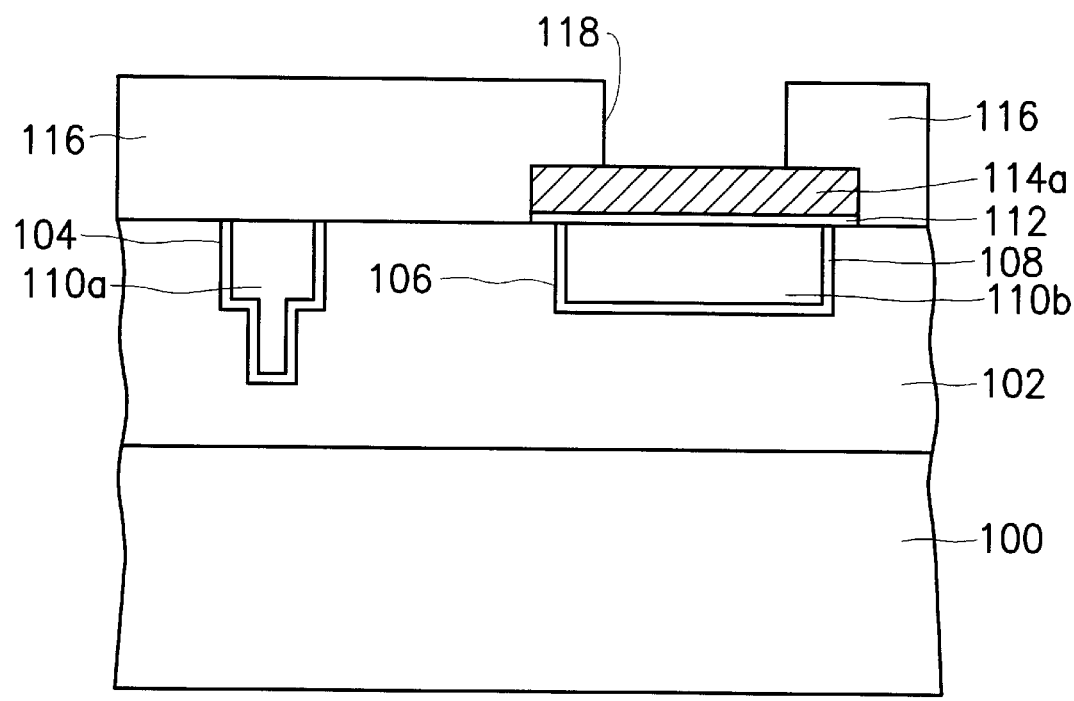
Figure 2:
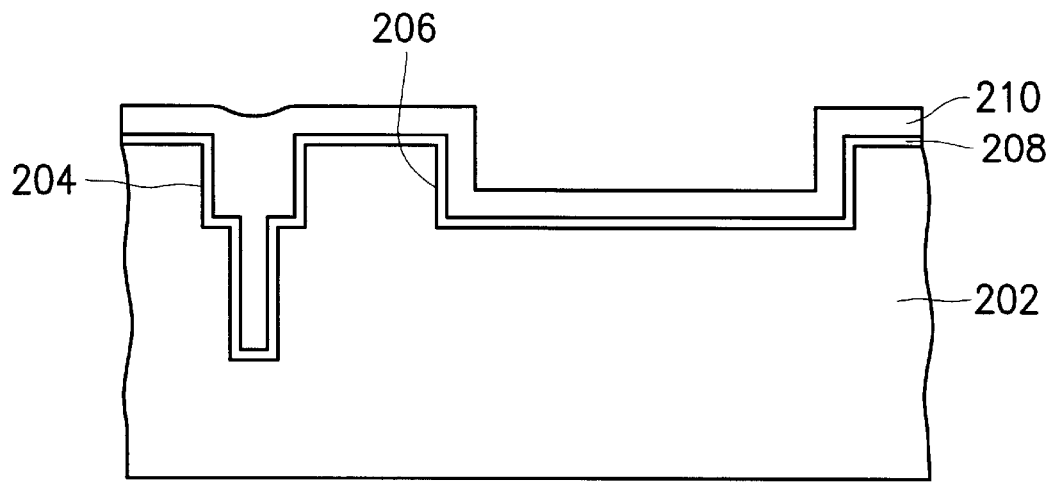
FIGS. 2 to 5 are schematic, cross-sectional views showing the steps of a first embodiment of the method of forming bonding pads.

In FIG. 2, an inter-metal dielectric layer 202 is provided. A dual damascene opening 204 and a trench 206 are formed in the inter-metal dielectric layer 202. The dual damascene 204 is smaller than the trench 206 in width. A conformal barrier layer 208 is formed on the inter-metal dielectric layer 202. A first metal layer 210 is formed on the barrier layer 208. The first metal layer 210 is formed in such a way that it entirely fills the dual darmascene opening 204 while the trench 206 is only partially filled by the first metal layer 210. There are numerous ways of forming the first metal layer 210 of such features. Because the width of the trench 206 is greater than that of the dual damascene 204, the process condition can be easily controlled to achieve this result. The material of the barrier layer 208 can be titanium/titanium nitride (Ti/TiN), titanium tungsten alloy (TiW), tantalum/ tantalum nitride (Ta/TaN) or tungsten nitride (WN). The preferred material of the first metal layer 210 comprises copper which is formed by electrode-plating, chemical vapor deposition (CVD), electrodeless-Cu technology or electrodeless-plating. The nature of electrode-plated Cu films, bottom-up fill-in at deep narrow features and conformal fill-in at wide features, is the most suitable technique to deposit the first metal layer 210.

Figure 3:
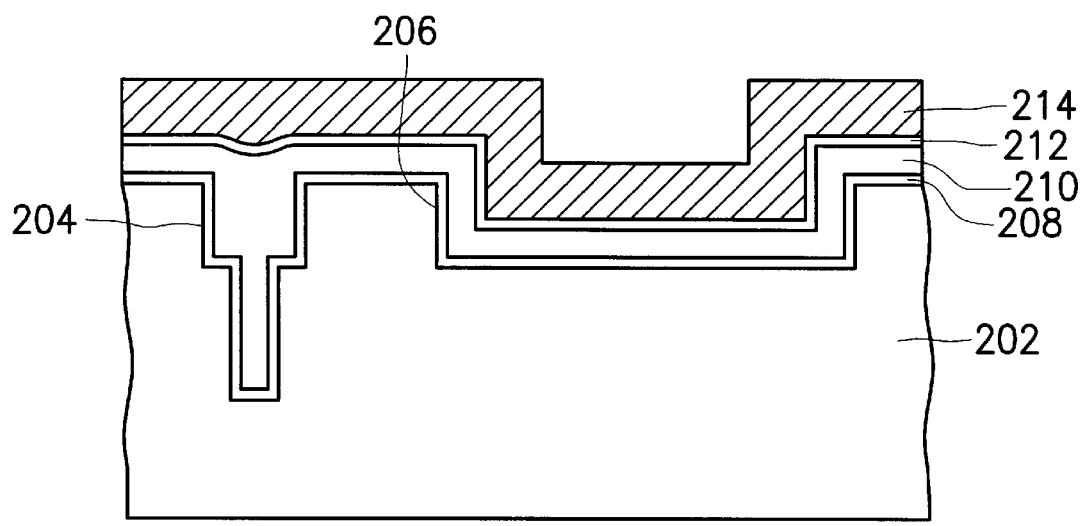

In FIG. 3, a glue layer 212 is formed on the first metal layer 210. A second metal layer 214 is formed on the glue layer 212 to fill fully the trench 206. The glue layer 212 is used to enhance adhesion between the first metal layer 210 and the second metal layer 214. A preferred material of the second metal layer comprises aluminum.

Figure 4:
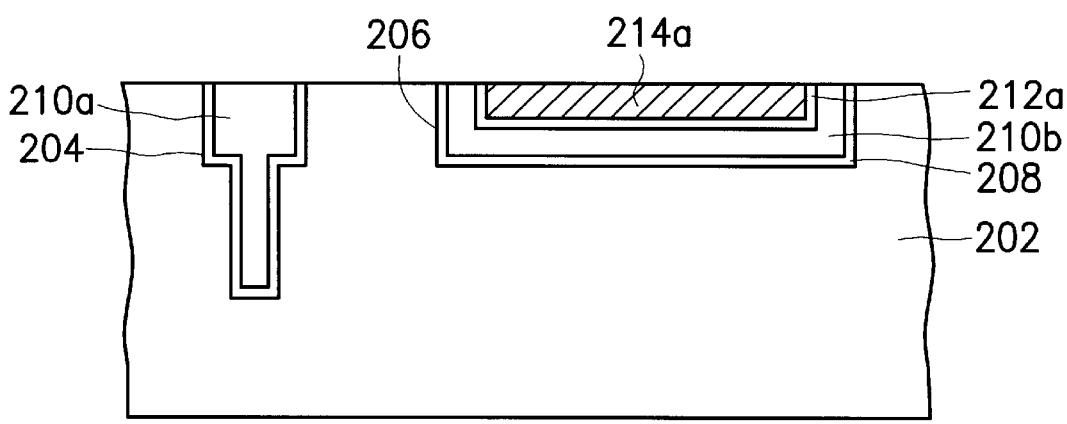

In FIG. 4, the second metal layer 214, the glue layer 212, the first metal layer 210 and the barrier layer 208 are partially removed by CMP to expose the inter-metal dielectric layer 202. A dual damascene structure 210a and a bonding pad structure are thus formed. The bonding pad structure comprises the remaining first metal layer 210b and the remaining second metal layer 214a in trench 206. In order to retain the remaining second metal layer 214a, the bottom surface of the second metal layer 214 in the trench 206 should be lower than the upper surface of the inter-metal dielectric layer 202 as shown in FIG. 3.

Figure 5:
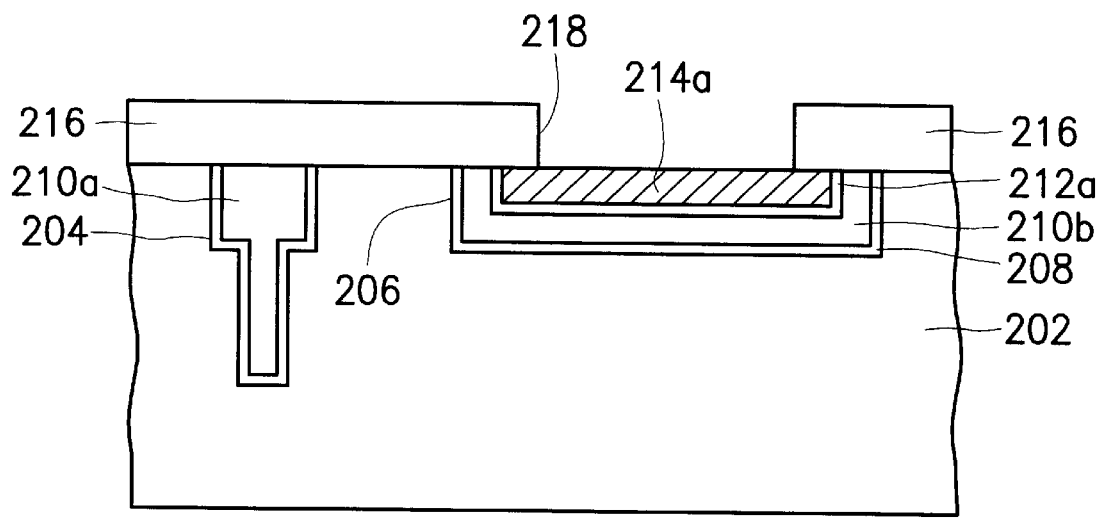

In FIG. 5, a passivation layer 216, such as a silicon nitride layer or a phosphosilicate glass (PSG) layer, is formed over the structure shown in FIG. 4. A bonding pad opening 218 is formed in the passivation layer 216 to expose the second metal layer 214a.

Second Embodiment

Figure 6:
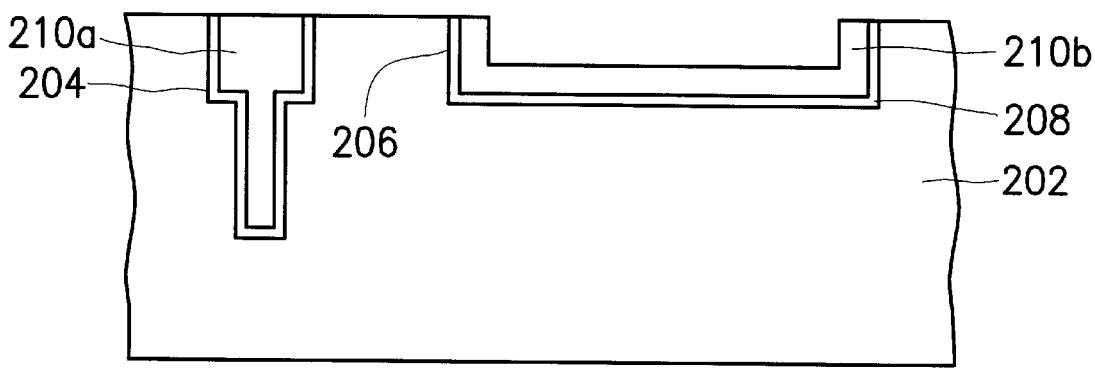

Referring to FIG. 6, a structure similar to that shown in FIG. 2 exhibits the same performance described in the first embodiment. Part of the first metal layer 210 is removed to expose the dielectric layer 202. A dual damascene structure 210a is formed. The trench 206 remains partially filled with the barrier layer 208 and the remaining first metal layer 210b.

Figure 7:
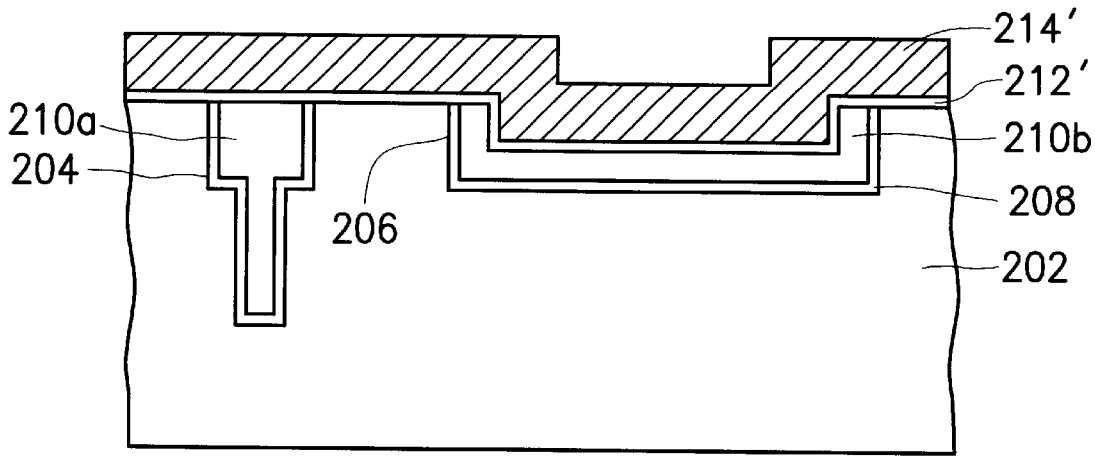

In FIG. 7, a glue layer 212' and a second metal layer 214' are sequentially formed on the dielectric layer 202 and the remaining first metal layer 210b. The trench 206 is fully filled by the second metal layer 214'. A preferred material of the second metal layer comprises aluminum.

A part of the second metal layer 214' and a part of the glue layer 212' are removed by CMP to expose the inter-metal dielectric layer 202. A bonding pad structure, which comprises the remaining first metal layer 210b and the remaining second metal layer 214a, is thus formed as shown in FIG. 4.

In FIG. 5, a passivation layer 216, such as a silicon nitride layer or a phosphosilicate glass (PSG) layer, is formed over the structure shown in FIG. 4. A bonding pad opening 218 is formed in the passivation layer 216 to expose the second metal layer 214a.

The first metal layer 210a, which is oxidized easily, is not exposed by the bonding pad opening 218. Problems of increasing the resistance of the bonding pad and decreasing semiconductor device reliability are thus prevented.

Furthermore, the remaining second metal layer used as a part of the bonding pad structure is formed by self-alignment. An additional mask used in a conventional process is omitted. The fabricating cost is reduced. The fabricating process is simplified.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of forming bonding pads, comprising the steps of:

providing an inter-metal dielectric layer having a dual damascence opening and a trench therein;

forming a conformal barrier layer on the inter-metal dielectric layer;

forming a conformal first metal layer on the barrier layer wherein the dual damascence opening is entirely filled while the trench is only partially filled;

forming a glue layer on the first metal layer;

forming a second metal layer by self-alignment on the glue layer to fully fill the trench; and polishing the second metal layer, the glue layer, the first metal layer and the barrier layer to expose the inter-metal dielectric layer.

2. The method according to claim 1, wherein the first metal layer comprises copper.

3. The method according to claim 2, wherein the first metal layer is formed by electrode-plating.

4. The method according to claim 2, wherein the first metal layer is formed by chemical vapor deposition.

5. The method according to claim 2, wherein the first metal layer is formed by electrodeless-Cu technology.

6. The method according to claim 2, wherein the first metal layer is formed by electrodeless-plating.

7. A method of forming bonding pads, comprising the steps of:

providing an inter-metal dielectric layer having a dual damascence opening and a trench therein;

forming a conformal barrier layer on the inter-metal dielectric layer;

forming a conformal first metal layer on the barrier layer wherein the dual damascene opening is entirely filled while the trench is only partially filled;

polishing the barrier layer and the first metal layer to expose the inter-metal dielectric layer;

forming a glue layer on the first metal layer and on the inter-metal dielectric layer;

forming a second metal layer by self-alignment on the glue layer to fully fill the trench; and polishing the second metal layer and the glue layer to expose the inter-metal dielectric layer.

8. The method according to claim 7, wherein the first metal layer comprises copper.

9. The method according to claim 8, wherein the first metal layer is formed by electrode-plating.

10. The method according to claim 8, wherein the first metal layer is formed by chemical vapor deposition.

11. The method according to claim 8, wherein the first metal layer is formed by electrodeless-Cu technology.

12. The method according to claim 8, wherein the first metal layer is formed by electrodeless-plating.

13. A method of forming bonding pads, comprising the steps of:

providing an inter-metal dielectric layer having a dual damascence opening and a trench therein;

forming a conformal first metal layer within the trench wherein the dual damascene opening is entirely filled while the trench is only partially filled;

forming a conformal glue layer on the first metal layer within the trench; and forming a second metal layer by self-alignment on the glue layer to fully fill the trench.

14. The method according to claim 13, wherein the first metal layer comprises copper.

15. The method according to claim 14, wherein the first metal layer is formed by electrode-plating.

16. The method according to claim 14, wherein the first metal layer is formed by chemical vapor deposition.

17. The method according to claim 14, wherein the first metal layer is formed by electrodeless-Cu technology.

18. The method according to claim 14, wherein the first metal layer is formed by electrodeless-plating.

19. The method according to claim 1, wherein a bottom surface of the second metal layer in the trench is lower than an upper surface of the inter-metal dielectric layer.

20. The method according to claim 1, wherein polishing the second metal layer, the glue layer, the first metal layer and the barrier layer is performed by chemical mechanical polishing.

21. The method according to claim 7, wherein a bottom surface of the second metal layer in the trench is lower than an upper surface of the inter-metal dielectric layer.

22. The method according to claim 7, wherein polishing the second metal layer and the glue layer is performed by chemical mechanical polishing.

23. The method according to claim 1, wherein polishing the barrier layer and the first metal layer is performed by chemical mechanical polishing.

* * * * *

UNITED STATES PATENT AND TRADEMARK OFFICE
CERTIFICATE OF CORRECTION

PATENT NO.     : 6,245,380 B1
DATED          : June 12, 2001
INVENTOR(S)    : Sun et al.

It is certified that error appears in the above-identified patent and that said Letters Patent is hereby corrected as shown below:

<u>Title page,</u>
References Cited, Item [56],
U.S PATENT DOCUMENTS, after "Hirsch et al." delete "427/86" and insert
-- 427/96 --.

Signed and Sealed this

Twenty-sixth Day of March, 2002

*Attest:*

*Attesting Officer*

JAMES E. ROGAN
*Director of the United States Patent and Trademark Office*